United States Patent [19]

Hamilton

[11] 4,370,831
[45] Feb. 1, 1983

[54] RF SHIELDED DOOR SEAL

[75] Inventor: William H. Hamilton, Seattle, Wash.

[73] Assignee: The Boeing Company, Seattle, Wash.

[21] Appl. No.: 211,322

[22] Filed: Nov. 28, 1980

[51] Int. Cl.³ .......................... E06B 7/16; H05K 9/00
[52] U.S. Cl. ................................ 49/477; 174/35 GC;
174/35 MS
[58] Field of Search ........ 49/477; 174/35 GC, 35 MS

[56] References Cited

U.S. PATENT DOCUMENTS

| | | | |
|---|---|---|---|
| 2,757,225 | 7/1956 | Dunn | 174/35 |
| 3,009,984 | 11/1961 | Lindgren | 174/35 |
| 3,236,935 | 2/1966 | Patton | 174/35 |
| 3,256,384 | 6/1966 | Lindgren | 174/35 |
| 3,507,974 | 4/1970 | Clark et al. | 49/477 X |
| 3,518,355 | 6/1970 | Luce | 174/35 |
| 4,177,353 | 12/1979 | McCormack | 49/477 X |

*Primary Examiner*—Phillip C. Kannan
*Attorney, Agent, or Firm*—Delbert J. Barnard; Eugene O. Heberer; Joan H. Pauly

[57] ABSTRACT

A door seal for a room shielded against electromagnetic radiation in which the door is mounted on a frame to move between open and closed positions. The door may be slidable or hinged. The door seal is formed of peripheral flexible plates that are welded together on their outer edges. Spaced between the plates and between the frame and the door there is a peripheral tubular bladder which when expanded with compressed air, for example, forces the plates outwardly against the door and the frame to form a seal. A seal is also formed within the plates by the bladder forced thereagainst. There are a series of peripherally spaced magnets adapted to hold the door sealing plate away from the door, when the bladder is not expanded. When the bladder is expanded, the plate is moved off of the magnets by the force of the expanding bladder. The force of the magnets on the plate is rendered ineffective as the bladder moves the plate away from the magnets and the effectiveness of the magnetic force is substantially increased as the bladder is unexpanded so that the plate is allowed to be withdrawn from the door by the force of the magnets.

22 Claims, 7 Drawing Figures

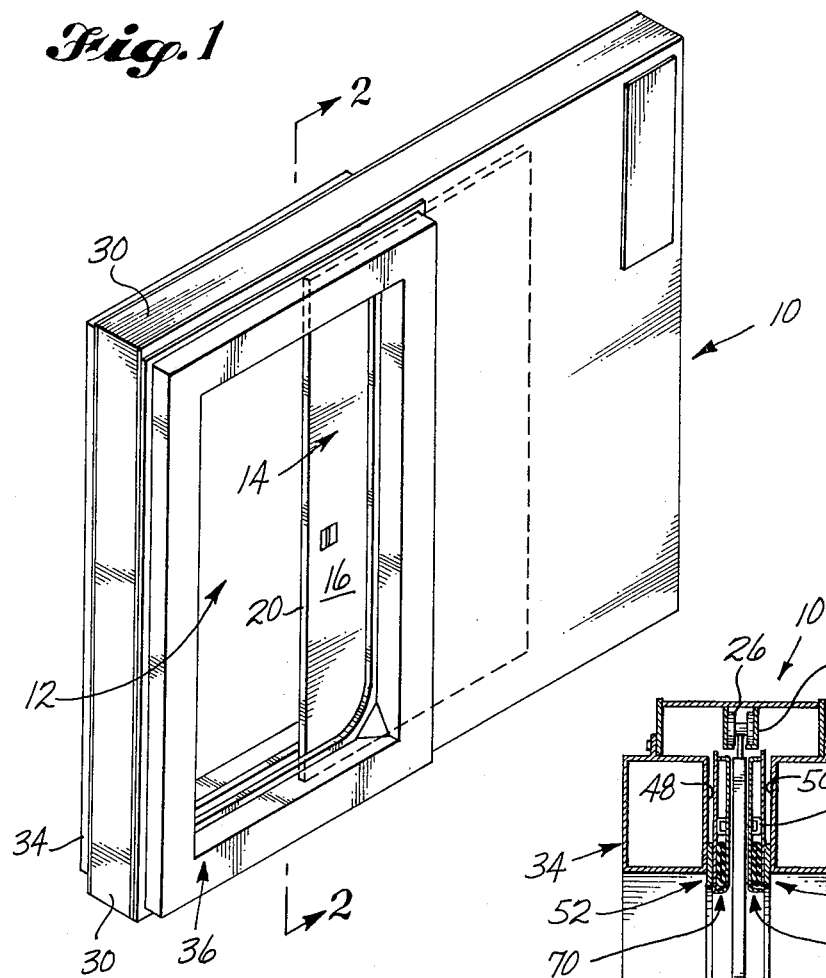
Fig. 1
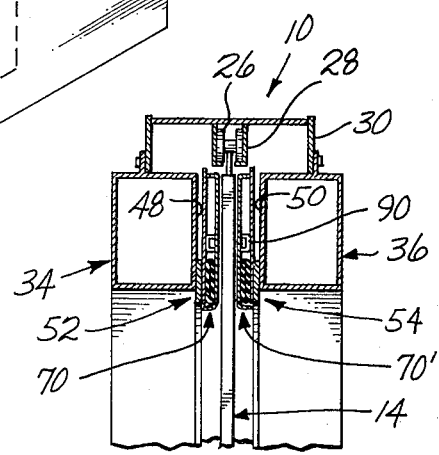
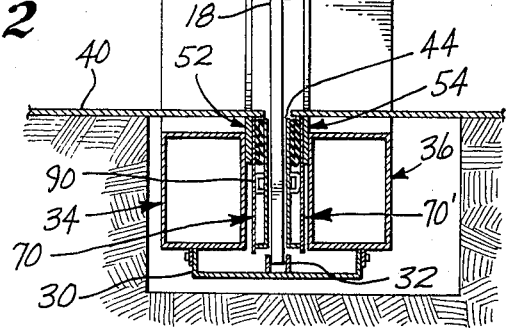
Fig. 2

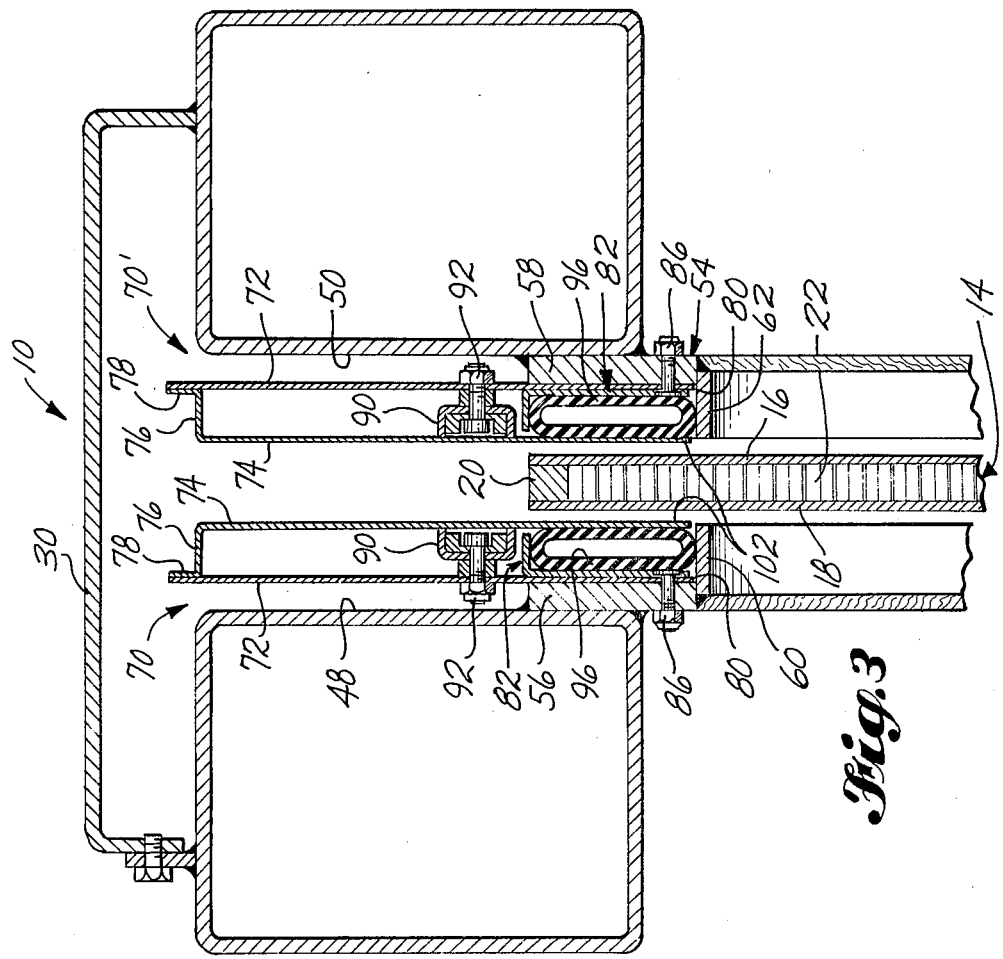
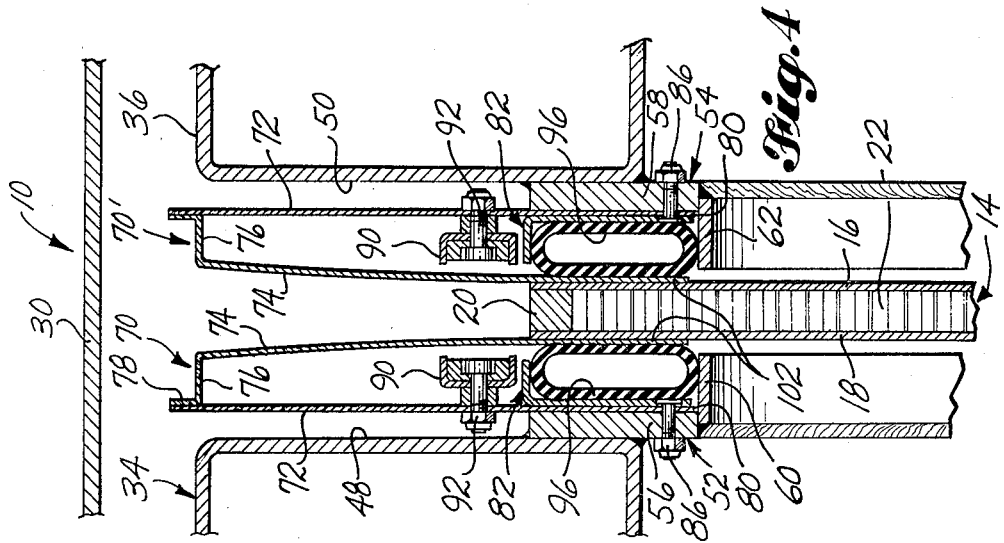

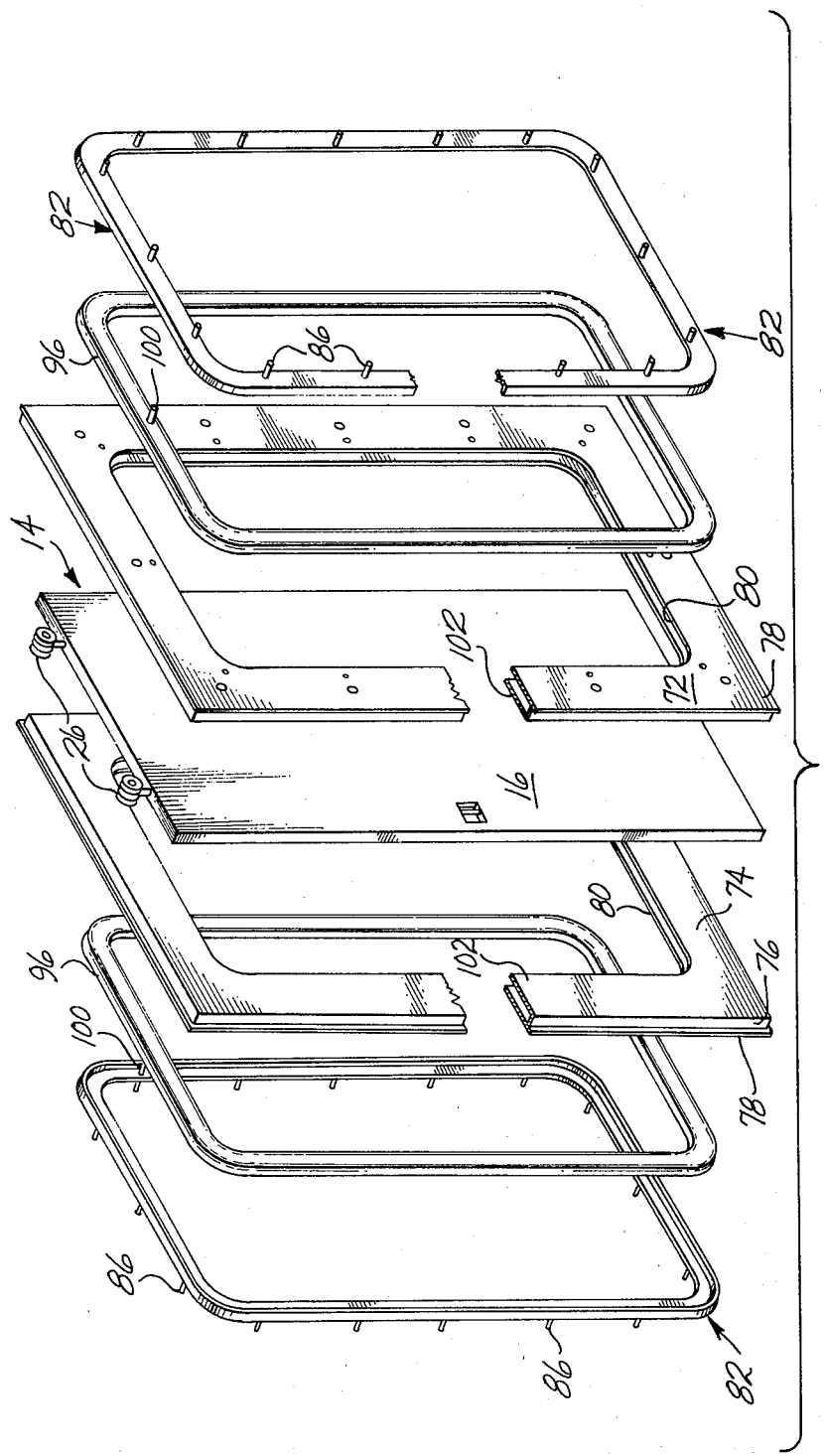

RF SHIELDED DOOR SEAL

BACKGROUND OF THE INVENTION

Rooms or enclosures shielded against electromagnetic radiation are in common use for RF emission testing equipment and other electronic testing.

Such shielded rooms are specially made enclosures and are of sufficient size to permit workmen to conduct various operations therein. The rooms must be provided with an opening of sufficient size to permit passage of workmen and equipment therethrough. A primary problem in the construction of such shielded enclosures is to provide a door which will completely seal the opening against electromagnetic radiation.

The shielded rooms and doors must be constructed of a metal which will afford protection against electromagnetic radiation.

In the prior art there have been serious problems associated with the design and construction of shielded doors as indicated in the following. The seals have not been effective because of gaps between the seal and the door. The reliability of the seals is poor due to fragile construction and thus will not stand extended usage.

The prior art doors utilizing integral expander tubes have been heavy, costly, complex, and subject to considerable maintenance. These doors have been inordinately thick so as to cause excessive vehicular and personal traffic problems caused by the inherently large gap in which the door slides. Where the doors are supplied with integral expander tubes they also must be supplied with compressed air lines to the door and thus require the moving of the air hoses along therewith.

The weight of the heavy doors causes considerable difficulty in manual operation that results in safety hazards.

An example of a relatively heavy, wide door having integral expander tubes is illustrated in U.S. Pat. No. 3,518,355 to Luce.

Another type of door having integral expander tubes between the door and frame is illustrated in U.S. Pat. No. 2,757,225 to Dunn. Here, the expander tubes are secured in recesses extending around the door edges. This type of arrangement is made to function only on hinged doors.

Three other prior art, United States Letters Patents deemed not to be pertinent to the present invention are No. 3,236,935 to Patton; No. 3,009,984 to Lindgren; and No. 3,256,384.

SUMMARY OF THE INVENTION

The present invention eliminates the foresaid problems by the provision of a thin light weight door, sealed by flexible plates or diaphragms extending peripherally on both sides of a sliding door or on the closing side of a hinged door. The metal plates are forced tightly against the door and door frame by means of a flexible expander tube bladder, actuated by compressed air. The faying surfaces of the door and frame are flame sprayed with a coating of tin to provide an efficient RF seal. The application of the tin on the faying surfaces is within the present state of the art.

The metal sealing lips or diaphragm side walls are returned to their non-sealing open position and there-held, when the expander tube is exhausted, by their inherent undeformed configurations and by a series of peripherally spaced return magnets.

A sliding door, according to the invention, is opened by compressed air actuated cylinder and closed by a counterweight. The light weight of the door allows a relatively small closing counterweight which can easily be overcome manually so as to provide easy and safe manual operation of the door.

Because the door is thin, the opening in the threshold is narrow, allowing easy flow of foot or vehicular traffic through the door with safety and ease and without the necessity of complex and troublesome mechanisms to cover the lower gap.

Because the lip seals are constructed similar to, and effectively in the configuration of a bellows, the metal lips or diaphragms can be flexed sufficiently to effect a positive seal and yet, not require complex linkages or hinges to allow seal movement.

The same type of seal can be used on a hinged door.

Accordingly, it is an object of the invention to provide an improved shielded frame and door, and seal therefor and in combination therewith.

It is another object of the invention to provide an improved seal for an RF shielded door and surrounding frame construction.

Further objects and advantages of the invention may be brought out in the following part of the specification wherein small details have been described for the competence of disclosure, without intending to limit the scope of the invention which is set forth in the appended claims.

BRIEF DESCRIPTION OF THE DRAWINGS

Referring now to the accompanying drawings which are for illustrative purposes:

FIG. 1 is an isometric view of an RF shielded door and wall construction including the present invention;

FIG. 2 is a partially cross-sectional elevational view, taken substantially along the line 2—2 in FIG. 1;

FIG. 3 is a fragmentary cross-sectional view illustrating the invention in detail with a sliding door in an unsealed condition;

FIG. 4 is a view similar to FIG. 3 in which the door and frame are sealed in a closed door position;

FIG. 5 is an exploded view of the various parts of the invention on both sides of a sliding door;

DESCRIPTION OF THE PREFERRED EMBODIMENTS

Figure 6:
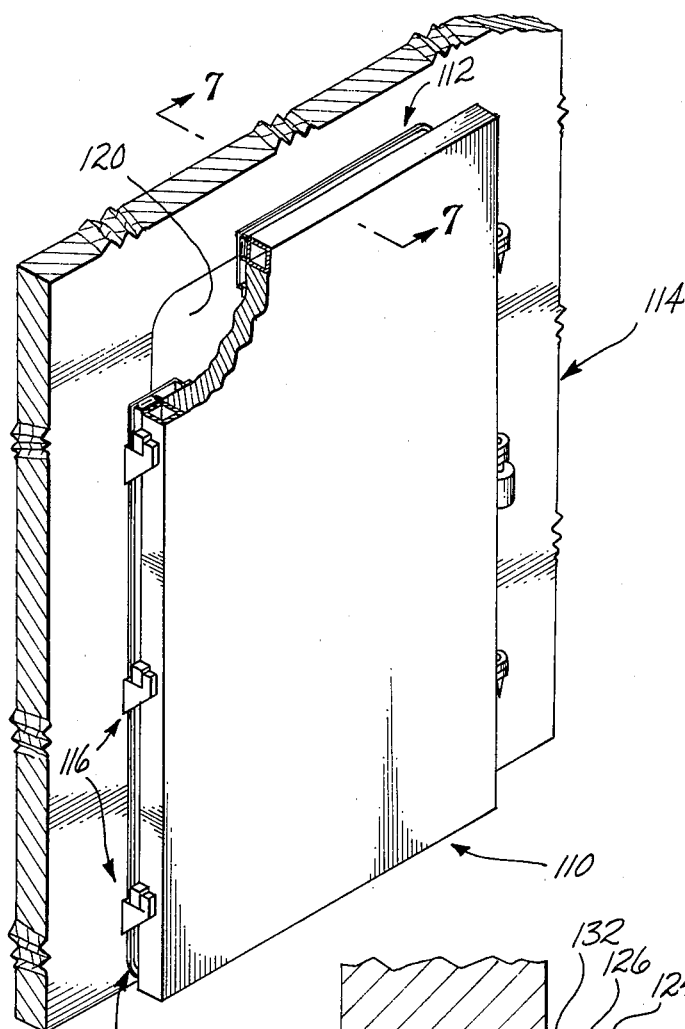
FIG. 6 is an isometric view of a hinged door in which the seal according to the invention is employed.

Referring again to the drawings, there is shown in FIGS. 1 and 2 a wall 10 of an electromagnetically shielded enclosure, having a personnel and vehicular opening 12 which is closable by an electromagnetically shielding sliding door 14. The door is comprised of two external steel sheets 16 and 18, FIGS. 3 and 4, a peripheral steel door edge 20, and a honeycomb core 22 extending between the two sheets 16 and 18.

The door 14 slides on two sets of rollers 26, FIG. 5, and a track 28, FIG. 2, supported from an upper portion of a peripheral frame member 30. The lower end of the door is guided by a track 32 in a lower portion of the member 30. Secured to the member 30 on opposite sides of the wall and door, and through which the opening 12 extends, are peripheral door frame members 34 and 36.

The peripheral door frame members are rectangular in cross-section.

Floor surfaces 40 and 42 extend through the door frame members and terminate adjacent the door passage to permit the door to pass through a space 44, FIGS. 1 and 2. The space 44 is relatively narrow to permit easy walking and vehicle traffic through the opening 12. Extending from opposing inner walls 48 and 50 of the frame members 34 and 36, there are peripheral L-shaped frame parts 52 and 54, respectively. The L-shaped members 52 and 54 are best seen in FIGS. 3 and 4. Long legs 56 and 58 of the L's are welded to sides 48 and 50, respectively, and short legs 60 and 62 of the L's form inner peripheral surfaces.

For the sliding door 14, electromagnetic radiation seals are comprised of two allochirally arranged peripheral parts, designated as 70 and 70'. Each seal is formed of two continuous flexible steel plates 72 and 74, transverse to the door edge 20, the inner plate 74 being bent at its outer end to extend in a transverse portion 76, which in turn is bent to have a portion 78 contiguous with the end of the plate 72. The portion 78 is resistance welded to the end of the plate 72 to form a continuous RF seal in the periphery of the plates. The corners are also welded to prevent any RF leakage at any corner joint. The flexibility of the plates and the welded ends cause them to perform as a bellows or as diaphragms.

The inner ends 80 of the plates 72 are secured to peripheral L-shaped retainers 82 and frame parts 56 and 58 by means of a multiple number of peripherally spaced bolts 86. A plurality of peripherally spaced U-shaped magnets 90 are secured to the legs 72 outwardly of the retainer 82 by bolts 92. The magnets 90 normally hold the legs 74 away from the door in a non-sealing position, FIG. 3, so as to prevent the door plates 16 and 18 from scraping the sides of the plates 74.

An expander tube or bladder 96 is fitted within the ends of the plates 72 and 74, extending peripherally so as to be in continuous contact with the inside of the plate 74 and both of the L-portions of the retainer 82. Inner edges of the bladders 96 rest on the frame parts 60 and 62. Compressed air is supplied to expand the bladder through an inlet outlet tube 100, FIG. 5, the bladder being expanded from the exhausted or retracted position in FIG. 3 to the expanded position in FIG. 4. When expanded, the bladders 96 force free ends 102 of the plates 74 into sealing contact with the door plates 16 and 18 and force the retainer 82 into sealing contact with the plates 72 so that the plates 72 form a seal with the frame parts 56 and 58.

The faying surfaces of the plates 16 and 18 peripherally inwardly of the plates 74, opposing surfaces plates 74, and the inner surfaces of the plates 72 along the surfaces of the frame parts 56 and 58 are flame sprayed with a coating of tin to provide efficient RF seals.

In operation, the sliding door 14 moves on the rollers 26 in the track as a conventional sliding door. The door is actuated by a pneumatic cylinder, not shown, through a cable and pulley system to open the door. The same cable system closes the light weight door by means of gravity from a counterweight, also not shown.

After the door is closed, the tubular bladder 96 is pressurized through the tube 100 and expanded against the movable plates 74 and the stationary plates 72 to provide a complete peripheral seal around the door and the frame parts 56 and 58. The complete door assembly then forms an effective RF shield.

A pneumatic control system, not shown, is used to control the door operation and is also used to expand the bladder 96. When the door is to be opened, the pneumatic system permits the bladder to be exhausted, from the expanded position shown in FIG. 4 to that shown in FIG. 3. As soon as the bladder is deflated, the forces of the magnets 90 attract the plates 74 and withdraw them to the positions shown in FIG. 3 so as to be free of the door to prevent damaging the faying surfaces on the plates and on the door when the door is opened and closed.

Because the effectiveness of the seal is enhanced by the force of the expanded bladder tube, the number of retaining bolts 86 holding the seal bellows 70, 70' and the retainers 82 to the door frame parts 56 and 58 can be minimized.

The magnets 90 are utilized in preference to springs in that the highest force occurs when the plates 72 and 74 are retracted, holding the plate 74 securely in the retracted position. Because the magnetic force decreases with distance, when the movable plates 74 are extended to the sealing positions, the magnetic forces thereon are relatively small and therefore not distracting from the sealing force exerted by the expander tube 96.

Figure 7:
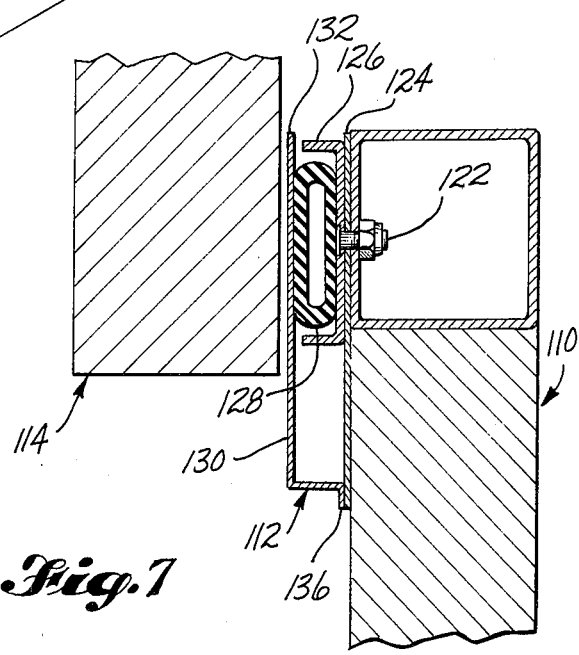
FIG. 7 is a fragmentary cross-sectional view of the hinged door, seal, and door frame, taken along the line 7—7 in FIG. 6.

In FIGS. 6 and 7, an embodiment of the invention is shown for use with a hinged door 110 where a seal 112 is formed having substantially the same structure as the seals 70, 70' in FIGS. 1-5. The wall 114 is that of an electromagnetically shielded enclosure and the door 110 also is constructed for RF shielding purposes. The door is held in a tightly closed position by conventional tightly fitting latching devices 116, not shown in detail.

In this embodiment the peripheral seal 112 may be secured around the edges of the door, as illustrated, to extend around the edges of the opening 120 in the enclosure. Or, it may be secured around the edges of the opening. A plurality of bolts 122 extend through a sealing plate 124 and into a channel-shaped retainer 126, the retainer securing a peripherally extending tubular bladder 128 adjacent its edges. A movable plate 130 abuts the bladder face in the retracted position shown in FIG. 7. An outer end 132 of the plate 130 is free and the plate at the other end is bent to extend alongside the inner end of the plate 124 to which it is resistance welded at 136 to provide an effective sealing arrangement.

The seal 112 functions in the same manner as that described with respect to FIGS. 1-5, the faying edges having been flame sprayed with tin. When the door is closed and latched, the tubular bladder 128 is expanded to tighten the plate 130 against the enclosure wall 114. The retainer and plate 124 are tightened together and the latter plate is sealingly tightened against the door 110 to complete the seal. When the door is to be opened, the bladder is exhausted and then the latches 116 can be opened.

In this embodiment, magnets are not required in that the plate 130 need not be held away from the door when it is unsealed. However, use of magnets is preferred to stabilize plate 130.

The invention and its attendant advantages will be understood from the foregoing description and it will be apparent that various changes may be made in the form, construction, and arrangements of the parts of the invention without departing from the spirit and scope thereof or sacrificing its material advantages, the arrangements hereinbefore described being merely by way of example. I do not wish to be restricted to the specific forms shown or uses mentioned except as defined in the accompanying claims.

What is claimed is:

1. In a wall construction having a peripheral seal for a door;
   a door frame on which the door is mounted to move from open and closed positions;
   an opening through said frame for passage when the door is in the open position;
   sealing means extending between and along opposing face portions of said door and frame to form a seal between the door and the frame when the door is closed, the door having peripheral edges transverse to said sealing means and to said opposing face portions of the door and frame;
   the improvment comprising:
   said sealing means having a first sidewall diaphragm movable toward and away from said door when the door is in the closed position to form and break a seal between said door and said sealing means, and a second sidewall diaphragm movable toward and away from said frame when the door is in the closed position to form and break a seal between said frame and said sealing means;
   said peripheral edges on said door being transverse to said first sidewall diaphragm forming said seal between the door and sealing means;
   operative means within said sealing means to move said first sidewall diaphragm to form the seal on the door and to break the seal on the door, and to move the second sidewall diaphragm to form the seal on the frame and to break the seal on the frame, said operative means comprising a substantially continuous expandable tubular bladder; and
   pulling means associated with said sealing means for holding said first sidewall in an unsealing position and for retracting first sidewall from a sealing position when said expandable bladder is unexpanded.

2. The invention according to claim 1 in which:
   said pulling means has its greatest pulling effect on said first side wall in its unsealing position and having its least pulling effect in the sealing position.

3. The invention according to claim 2 including:
   a retainer for said bladder within said side walls and adjacent said free end.

4. The invention according to claim 2 in which:
   said pulling means comprise a plurality of magnets peripherally arranged with said side walls,
   each magnet being secured on one of said side walls opposite a side wall of magnetic material,
   each magnet being adapted to hold said magnetic material in an unsealing position when said bladder is unexpanded;
   said bladder being adapted to move said magnetic material out of contact from said magnets when said bladder is expanded.

5. The invention according to claim 1 in which:
   said frame has two spaced parts around the periphery of said opening, said door being adapted to slide between said spaced parts and fit between said parts in the closed position;
   one of said sealing means being on each side of said door extending from a respective one of said parts.

6. A radiation seal for use between opposing face portions of a metal door frame which defines a pasage opening and a border portion of a metal door which extends entirely about the passage opening, to seal against radiation leakage between such door border and such door frame when the door is closed, said seal comprising:
   a metal bellows member positionable between the door frame and the door border, said metal bellows extending entirely around the passage opening and having an outer periphery, a center opening, and an inner periphery bordering said center opening, said bellows member comprising a pair of parallel, laterally spaced apart, solid metal diaphragm walls and a solid surface metal peripheral wall extending about one of the peripheries of the bellows member and integrally connecting the two diaphragm walls together at such periphery to form a closed periphery in a manner preventing any radiation leakage at such connection, with the other periphery being open and said two diaphragm walls having continuous free edges at such open periphery; and
   an inflatable tube means within the space between the two diaphragm walls, extending about the passage opening and positioned to urge the two diaphragm side walls laterally apart when inflated, to place the continuous free edge of one into metal-to-metal sealing contact with a face of the border portion of the metal door and the continuous free edge of the other into metal-to-metal sealing contact with an opposing face of the metal door frame.

7. The radiation seal according to claim 6, further comprising means for securing one of said diaphragm walls to one of said metal door and metal door frame.

8. A radiation seal according to claim 6, wherein said peripheral wall is a portion of one of the metal diaphragm walls which has been bent so as to extend at an angle from such diaphragm wall towards the second diaphragm wall, and wherein said peripheral wall includes a flange which is a portion of the peripheral wall which has been bent to extend substantially parallel with the second diaphragm wall, and wherein said flange and a border portion of the second diaphragm wall are in contact with each other and are resistance welded.

9. A radiation seal according to claim 6, further comprising a retainer for said inflatable tube means positioned within said metal bellows adjacent the open periphery of the metal bellows member.

10. A radiation seal
    for use between a metal door frame which defines a passage opening and a metal door which includes a border portion extending entirely about the passage opening, to seal against radiation leakage between opposing face portions of such door border and such door frame when the door is closed, said seal comprising:
    a metal bellows member positionable between the door frame and the door border, said metal bellows having an outer periphery, a center opening, and an inner periphery bordering said center opening, said bellows member comprising a pair of laterally spaced apart metal diaphragm walls and a metal peripheral wall extending about one of the peripheries of the bellows member and integrally connecting the two diaphragm walls together at such periphery in a manner preventing any radiation leakage at such connection, with the two diaphragm walls having free edges at the other periphery;
    an inflatable tube means within the space between the two diaphragm walls, extending about the passage opening and arranged to push the two diaphragm walls apart when inflated, one into sealing contact with a face of the border portion of the metal door and the other into sealing contact with an opposing face of the metal door frame; and a plurality of magnets in the space between the two diaphragm walls, spaced about said metal bellows member, said magnets being secured to one of said diaphragm walls, with the other diaphragm wall being constructed from a magnetic material so that there is an attraction between it and said magnets.

11. A radiation seal according to claim 10, wherein the inflatable tube means is located within the space between the two diaphragm walls closely adjacent the free ends of the diaphragm walls, and wherein the magnets are located within said space between the inflatable tube means and the peripheral wall.

12. A radiation seal for use between a metal door frame which defines a passage opening and a metal door which includes a border portion extending entirely about said passage opening, to seal against radiation leakage between the door and the door frame when the door is closed, and operable by inflation of an internal inflatable tube extending substantially about the passage opening:

a metal bellows member positionable between adjacent faces of a door frame and the border portion of the door, said bellows member having an outer periphery, a center opening, and an inner periphery bordering said center opening, said bellows member comprising a pair of laterally spaced apart metal diaphragm walls and a metal peripheral wall extending about one of the peripheries of the bellows member and integrally connecting the two diaphragm walls together at such periphery in a manner preventing any radiation leakage at such connection;

said two diaphragm walls having free edges at the other periphery of the bellows member;

said two diaphragm walls being relatively stiff and such stiffness and the peripheral connection serving to normally bias the diaphragm walls into a retracted position in which the lateral distance between said diaphragm walls is less than the transverse dimension of the inflatable tube when it is in its inflated condition and is less than the face-to-face spacing of the door border and the door frame;

said diaphragm walls being flexible enough so that when subjected to a separating internal force, provided by an inflatable tube within the space between the two diaphragm walls, such walls can bend apart at their free edges, so that the free edge portion of one of the diaphragm walls can move into sealing contact with a face of the border portion of the metal door and the free edge of the other diaphragm wall can move into sealing contact with an opposing face of the metal door frame; and a plurality of magnets in the space between the two diaphragm walls, spaced about said metal bellows member, said magnets being secured to one of said diaphragm walls, with the other diaphragm wall being constructed from a magnetic material so that there is an attraction between it and said magnets.

13. A radiation seal according to claim 12 wherein the free edge portions of the diaphragm walls, and the surface portions of the door which they contact when in sealing contact with the door, are tin coated so as to provide an efficient RF seal.

14. A sliding door and frame assembly for a room that is shielded against leakage of electromagnetic radiation when the door is in its closed position, comprising:

a sliding door;

a door frame on one side of the door, defining a passage opening, said door frame including a vertical surface portion which opposes and is spaced outwardly from a vertical border portion of the door, all the way around the passage opening;

seal means in the space between the vertical portion of the door frame and the vertical border portion of the door, said seal means comprising a metal bellows having a center passage opening and comprising a pair of parallel, laterally spaced apart metal diaphragms, and a metal peripheral wall integrally connecting the two diaphragms together at the outer periphery of the bellows in a manner preventing any radiation leakage at such connection, said two diaphragms having continuous free edges defining the center passage opening of the bellows;

means connecting one of said bellows to the metal door frame, with a portion of one diaphragm positioned against the vertical surface of the door frame;

said metal bellows having a relaxed position in which the second diaphragm is spaced from the vertical border portion of the door; and inflatable tube means within the space between the two diaphragms, extending about the center passage opening of the bellows and positioned to force the two diaphragms laterally apart when inflated, to place the continuous free edge of the second diaphragm into metal-to-metal sealing contact with the vertical border portion of the metal door and the continuous free edge of the first diaphragm into metal-to-metal sealing contact with the vertical surface of the metal door frame.

15. A sliding door and frame assembly according to claim 14, wherein the center passage opening through the bellows is generally rectangular in shape but having rounded corners, and the distance between the continuous free edges of the diaphragms and the closed outer periphery of the bellows is sufficient that the continuous free edges of the metal diaphragms can deflect sufficiently to make good sealing contact with the door frame and the door, including at such corners.

16. A radiation seal according to claim 14, wherein the free edge portion of the diaphragm wall, and the surface portion of the door which it contacts when in sealing contact with the door, are tin coated so as to provide an efficient RF seal.

17. A sliding door and frame assembly according to claim 14, wherein said metal door frame also includes a bottom wall which extends horizontally from said metal door frame towards the door, at the bottom of the passage opening, said door sill having an edge portion which is positioned contiguous the door.

18. A sliding door and frame assembly according to claim 17, wherein the metal door frame includes a sidewall portion at each side of the passage opening, and a top wall portion, each of which extends horizontally towards the door and has an edge portion contiguous the door, said top, bottom and sidewalls being interconnected and together defining and bordering the passage opening through the metal door frame.

19. A sliding door and frame assembly according to clai 18, wherein said inflatable tube means is positioned immediately outwardly of said top, bottom and sidewalls.

20. A sliding door and frame assembly according to claim 18, wherein said inflatable tube means surrounds said wall.

21. A swinging door and frame assembly for a room that is shielded against leakage of electromagnetic radiation when the door is in its closed position, comprising:
- a swinging door of a given height and width having a vertical border portion;
- a door frame on one side of the door, defining a passage opening which is both narrower and shorter than the door, said door frame including a vertical border portion which opposes the vertical border portion of the door, all the way around the passage opening;
- means mounting the door onto said door frame, for swinging movement of the door towards and away from the frame, such that the vertical border portion of the door is in an opposing spaced relationship with the vertical border portion of the door frame when the door is in its closed position;
- seal means in the space between the opposing border portions of the door frame and the door, comprising a metal bellows which extends all the way around the passage opening and includes a center passage opening, a first vertical metal diaphragm adjacent the door, a second metal diaphragm which is spaced from the first metal diaphragm towards the door frame, and an inner peripheral wall which connects the two metal diaphragms together and forms a closed periphery for the metal bellows extending about the center passage opening, said metal diaphragms having continuous free edges at the outer periphery of the bellows; and
- inflatable tube means between the two diaphragms, extending about the passage opening and positioned to force the two diaphragms relatively apart when inflated, to place the continuous free edge of one diaphragm into metal-to-metal sealing contact with the metal door and the continuous free edge of the other diaphragm into metal-to-metal sealing contact with the metal door frame.

22. A radiation seal according to claim 21, wherein the free edge portion of the diaphragm wall, and the surface portion of the door which it contacts when in sealing contact with the door, are tin coated so as to provide an efficient RF seal.

* * * * *